United States Patent
Huang et al.

(10) Patent No.: US 7,539,058 B2
(45) Date of Patent: May 26, 2009

(54) NON-VOLATILE MEMORY AND OPERATING METHOD THEREOF

(75) Inventors: Chun-Jen Huang, Tainan (TW); Chia-Jung Chen, Chiayi (TW); Hsin-Yi Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 7 days.

(21) Appl. No.: 11/826,600

(22) Filed: Jul. 17, 2007

(65) Prior Publication Data
US 2009/0021980 A1 Jan. 22, 2009

(51) Int. Cl.
*G11C 11/34* (2006.01)
(52) U.S. Cl. .................... 365/185.2; 365/200
(58) Field of Classification Search ........... 365/185.2, 365/200
See application file for complete search history.

(56) References Cited

U.S. PATENT DOCUMENTS

| | | | | |
|---|---|---|---|---|
| 6,496,429 B2 * | 12/2002 | Murai et al. | ............... | 365/200 |
| 6,538,935 B1 * | 3/2003 | Suzuki | ..................... | 365/200 |
| 7,230,852 B2 * | 6/2007 | Mitani et al. | ........... | 365/185.18 |
| 2002/0131307 A1 * | 9/2002 | Murai et al. | ............... | 365/200 |

* cited by examiner

*Primary Examiner*—Michael T Tran
(74) *Attorney, Agent, or Firm*—Bacon & Thomas, PLLC

(57) ABSTRACT

A non-volatile memory and an operating method thereof. The non-volatile memory includes a memory cell array, a first dummy cell array, an address decoding unit and a synchronous programming circuit. The memory cell array includes a first memory cell, and the first dummy cell array includes a first dummy cell. The first dummy cell is adjacent to a first side of a memory cell array and corresponds to the first memory cell. The address decoding unit receives an address signal for decoding. When the address signal is a relative address of the first dummy cell, the synchronous programming circuit controls the first dummy cell and the first memory cell to be synchronously programmed.

14 Claims, 6 Drawing Sheets

NON-VOLATILE MEMORY AND OPERATING METHOD THEREOF

BACKGROUND OF THE INVENTION

1. Field of the Invention

The invention relates in general to a non-volatile memory and an operating method thereof, and more particularly to a non-volatile memory having an improved erased phenomenon, and an operating method thereof.

2. Description of the Related Art

The current electronic device usually has a non-volatile memory for storing a lot of data. In order to process and store the information, the non-volatile memory must have the function of programming or erasing array cells in a flash memory.

FIG. 1 (Prior Art) is a schematic illustration showing a conventional non-volatile memory 10. Referring to FIG. 1, the non-volatile memory 10 includes a memory cell array 110, dummy cell arrays 122, word lines 160 and bit lines 150. The dummy cell arrays 122 are disposed on two sides of the memory cell array 110, and the memory cell array 110 and the dummy cell arrays 122 are respectively composed of memory cells 1122 and dummy cells 1222. The memory cells 1122 and the dummy cells 1222 are respectively coupled to the bit lines 150, and are respectively controlled by the word lines 160.

Each of the memory cell 1122 and the dummy cell 1222 may be a transistor having an oxide-nitride-oxide (ONO) structure. Thus, data can be stored in the ONO structure of the transistor in the form of charges. The method of programming the transistor may be implemented by injecting channel hot electrons (CHEs) into the ONO structure. The erasing operation may be implemented by way of hot hole injection (HHI), which is generated by the band-to-band tunneling, into the ONO structure. When the data stored in the ONO structure is ready to be read, the current flowing through the drain and the source of the transistor is sensed by sense amplifier. The charges may be stored in the ONO structure on two connection edges of the channel layer of the transistor, so the transistor may store two bits of data.

However, the dummy cell 1222 adjacent to the memory cell 1122 is in the erased state for a long time, so the over erase phenomenon tends to occur. When the over erase phenomenon occurs, a bit line to bit line current leakage $1_{leak}$ flows through the dummy cell 1222 adjacent to the memory cell 1122 and thus influences the read result in reading period of the non-volatile memory.

FIG. 2 (Prior Art) is a schematic illustration showing a program method of the conventional non-volatile memory. Referring to FIG. 1, the program method of the conventional non-volatile memory includes the following steps. First, as shown in step 510, the main array program sequence start to be operated. Wherein, the main array is such as the memory cell array 110. Next, as shown in step 520, the main array is programmed. Then, as shown in step 530, main array passes program verification. Next, as shown in step 540, the main array program sequence is ended. Then, as shown in step 550, the boundary bit program sequence start to be operated. Next, as shown in step 560, the threshold voltage Vth of the boundary bit is programmed to a very high voltage level by a strong program bias voltage without verifying. Wherein, the boundary bit is such as one end of the dummy cell 1222 adjacent to the memory cell 1122. Then, as shown in step 570, the boundary bit program sequence is ended.

SUMMARY OF THE INVENTION

The invention is directed to a non-volatile memory and an operating method thereof for synchronously programming dummy cells adjacent to a memory cell array. Consequently, it is possible to prevent the over erase phenomenon from happening so that the correct read result may be obtained. Furthermore, because the dummy cells and the memory cell array are synchronously programmed, the programming time of the non-volatile memory is shortened and the testing cost of the non-volatile memory can be reduced.

According to a first aspect of the present invention, a non-volatile memory is provided. The non-volatile memory includes a memory cell array, a first dummy cell array, an address decoding unit and a synchronous programming circuit. The memory cell array includes a first memory cell, and the first dummy cell array includes a first dummy cell. The first dummy cell is adjacent to a first side of the memory cell array and corresponds to the first memory cell. The address decoding unit receives an address signal for decoding. When the address signal is a relative address of the first dummy cell, the synchronous programming circuit controls the first dummy cell and the first memory cell to be synchronously programmed.

According to a second aspect of the present invention, an operating method of the non-volatile memory is provided. The non-volatile memory includes a memory cell array and a first dummy cell array. The memory cell array includes a first memory cell, and the first dummy cell array includes a first dummy cell. The first dummy cell is adjacent to a first side of the memory cell array and corresponds to the first memory cell. The operating method of the non-volatile memory includes the following steps. First, an address signal for decoding is received. Next, the first dummy cell and the memory cell are synchronously programmed when the address signal is a relative address of the first dummy cell.

The invention will become apparent from the following detailed description of the preferred but non-limiting embodiment. The following description is made with reference to the accompanying drawings.

DETAILED DESCRIPTION OF THE INVENTION

In order to prevent the over erase phenomenon from happening, a non-volatile memory and an operating method thereof will be described in the following embodiment. The invention synchronously programs dummy cells adjacent to a memory cell array. Consequently, it is possible to prevent the over erase phenomenon from happening so that the correct read result may be obtained. Furthermore, because the dummy cells and the memory cell array are synchronously programmed, the programming time of the non-volatile memory is shortened and the testing cost of the non-volatile memory can be reduced.

Figure 1:
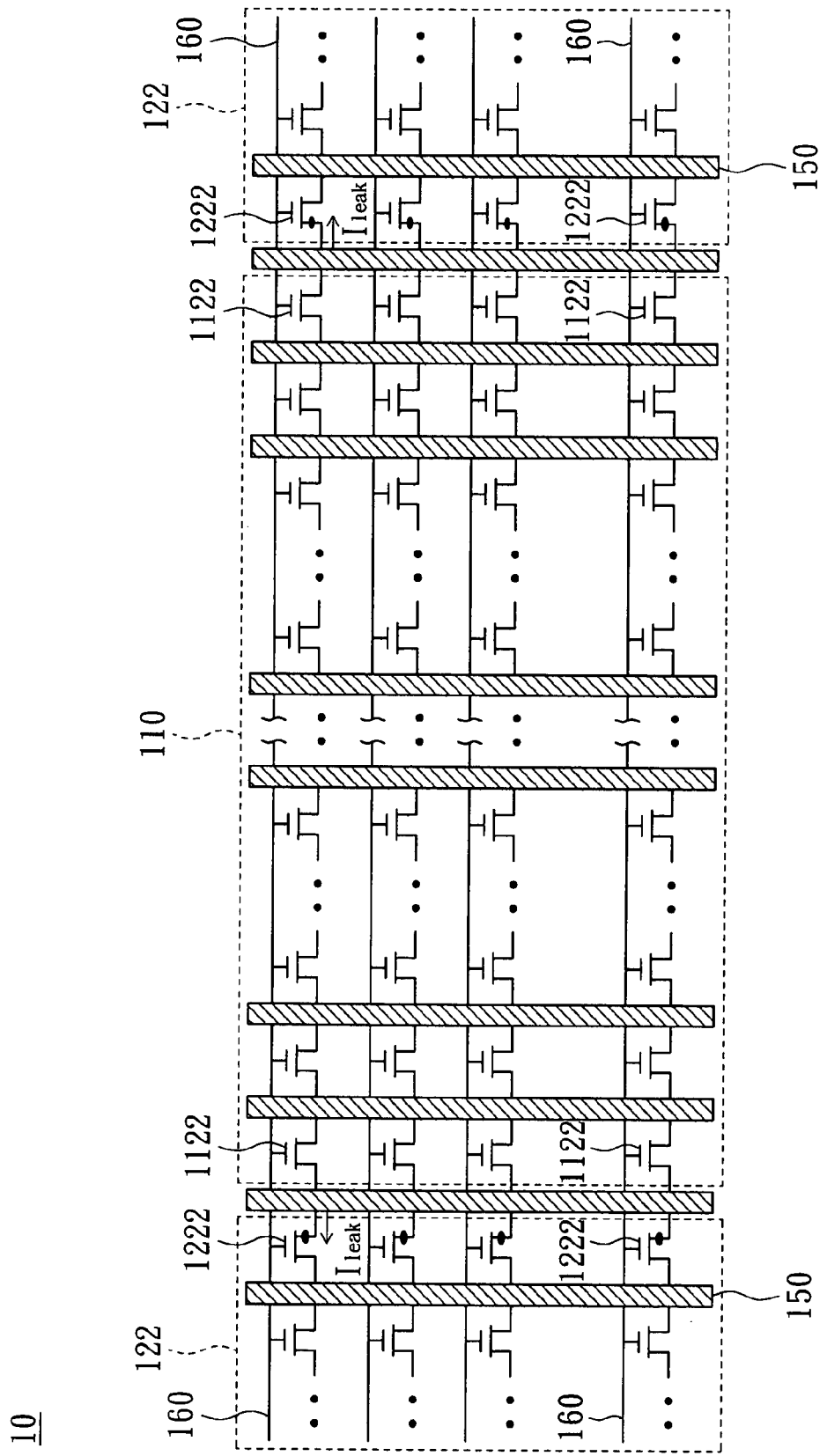
FIG. 1 (Prior Art) is a schematic illustration showing a conventional non-volatile memory.
Figure 2:
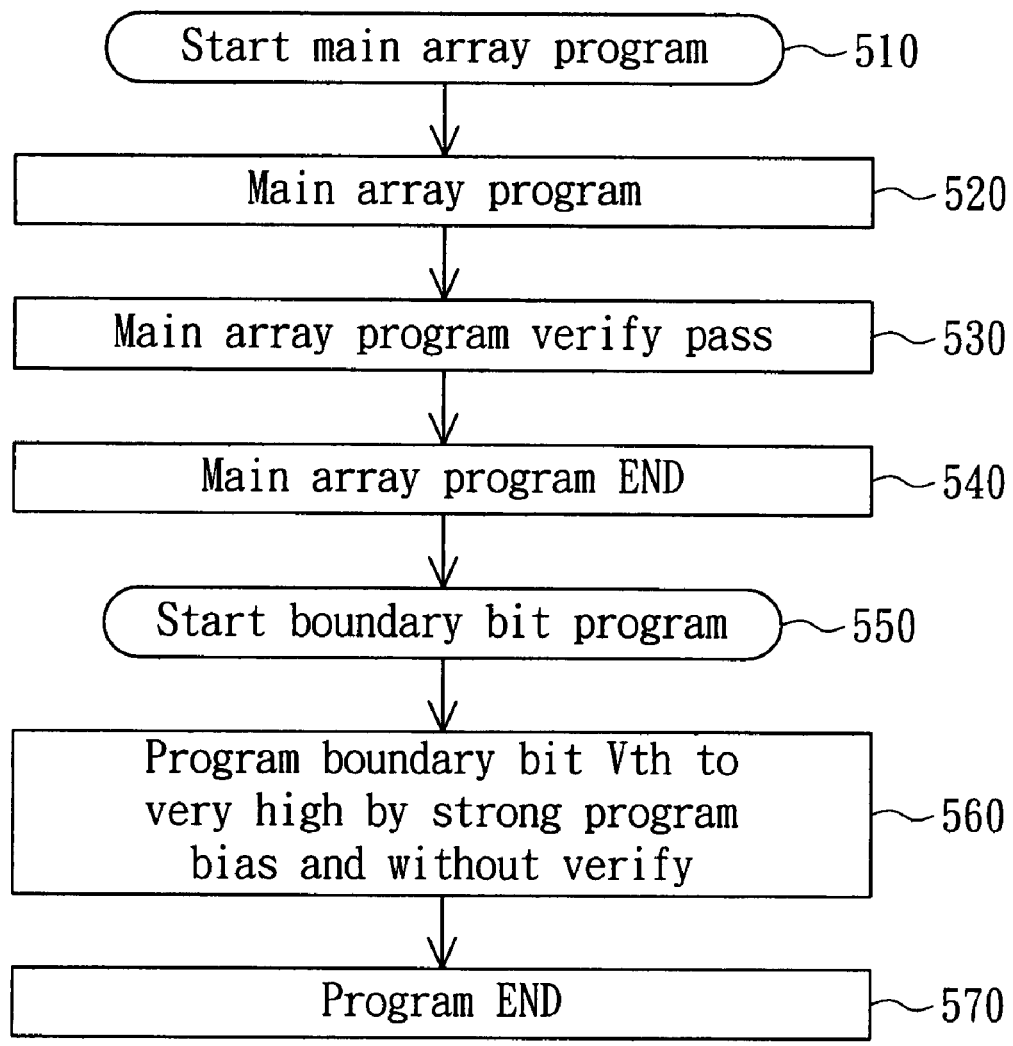
FIG. 2 (Prior Art) is a schematic illustration showing a program method of the conventional non-volatile memory.
Figure 3:
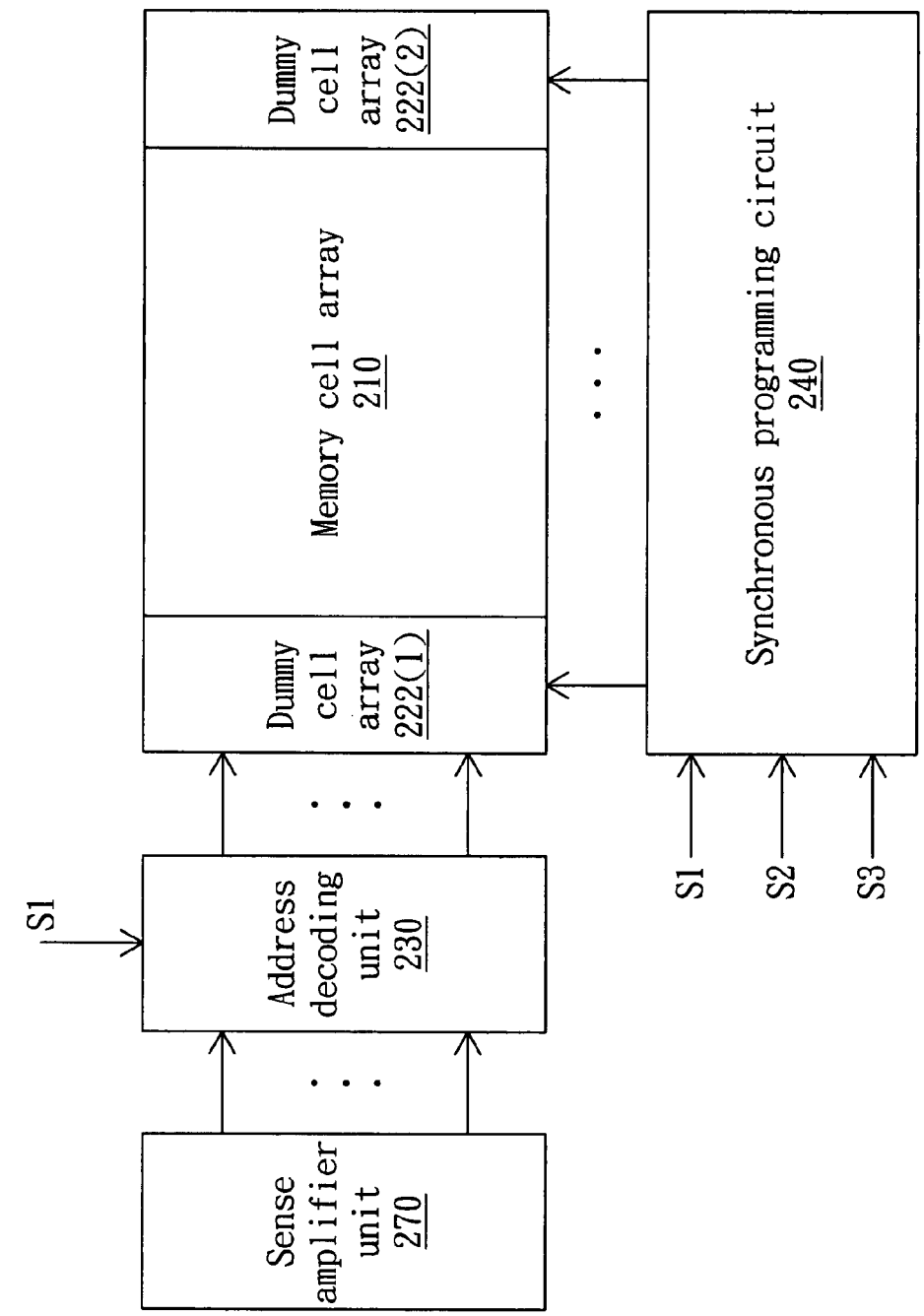
FIG. 3 is a schematic block diagram showing a non-volatile memory according to a preferred embodiment of the invention.
Figure 4:
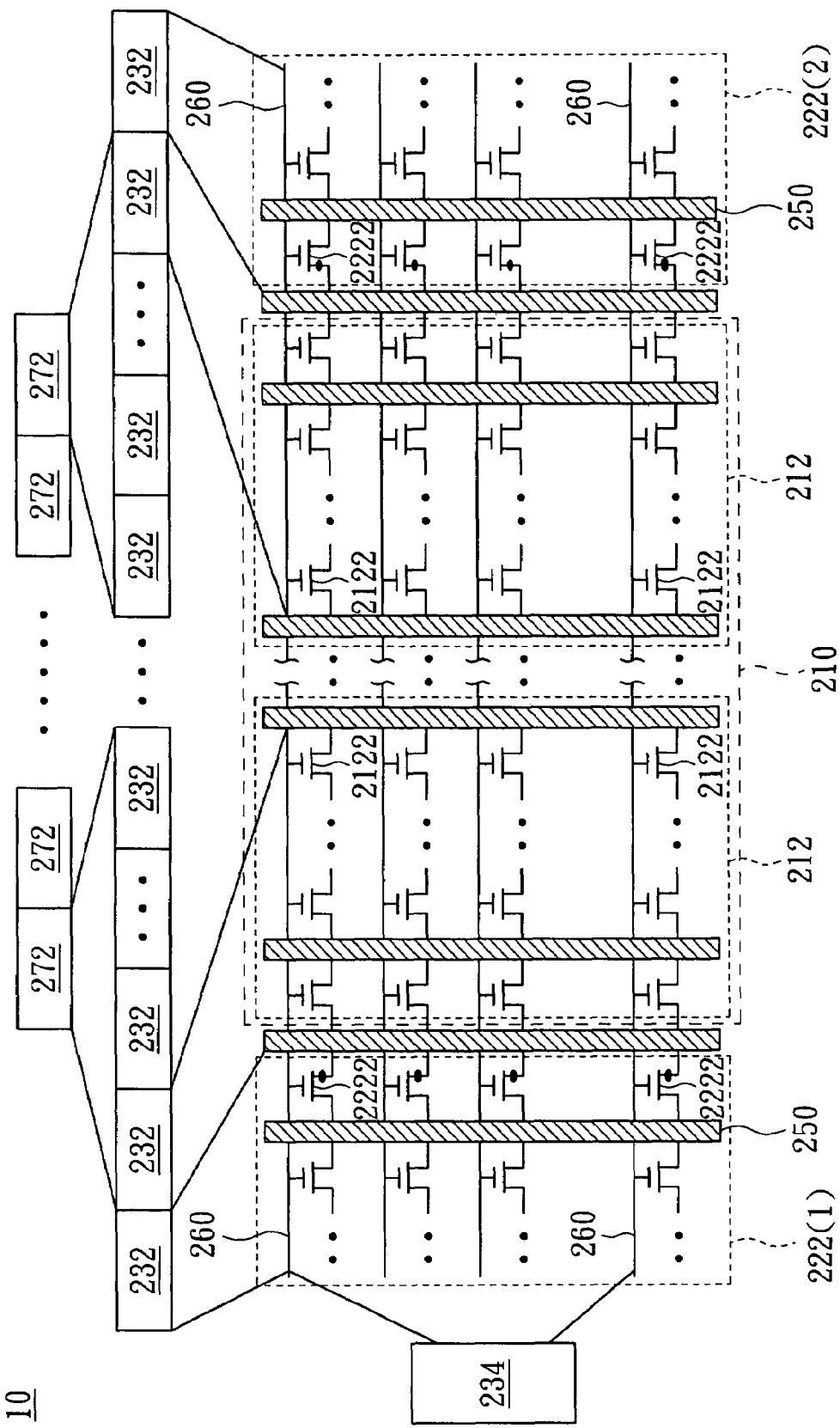
FIG. 4 is a partially schematic illustration showing the non-volatile memory.

FIG. 3 is a schematic block diagram showing a non-volatile memory 20 according to a preferred embodiment of the invention. FIG. 4 is a partially schematic illustration showing the non-volatile memory. Referring to FIGS. 2 and 3, the non-volatile memory 20, such as a non-volatile flash memory, includes a memory cell array 210, a dummy cell array 222(1), a dummy cell array 222(2), an address decoding unit 230, a synchronous programming circuit 240, bit lines 250, word lines 260 and a sense amplifier unit 270. The dummy cell array 222(1) and the dummy cell array 222(2) are adjacent to two sides of the memory cell array 210, respectively.

The memory cell array 210 includes many sub-memory cell arrays 212. Each sub-memory cell array 212 has memory cells 2122 arranged in M rows and N columns, wherein M and N are non-zero positive integers. The dummy cells 2222 of the dummy cell array 222(1) and the dummy cell array 222(2) are also arranged in M rows and N columns. The memory cells 2122 and the dummy cells 2222 are controlled by the word lines 260 and coupled to the bit lines 250, respectively.

Each of the memory cell 2122 and the dummy cell 2222 is a transistor having an oxide-nitride-oxide (ONO) structure. Thus, data can be stored in the ONO structure of the transistor in the form of charges. The method of programming the transistor may be implemented by injecting channel hot electrons (CHEs) into the ONO structure. The erasing operation may be implemented by way of hot hole injection (HHI), which is generated by the band-to-band tunneling, into the ONO structure. When the data stored in the ONO structure is ready to read, the current flowing through the drain and the source of the transistor is sensed by sense amplifier unit 270. The charges may be stored in the ONO structure on two connection edges of the channel layer of the transistor, so the transistor may store two bits of data.

The dummy cells 2222 disposed in the $N^{th}$ column of dummy cell array 222(1) are adjacent to a first side of the memory cell array 210, and have second ends coupled to first ends of the first column of memory cells 2122 of the neighbor sub-memory cell array 212. Similarly, the dummy cells 2222 disposed in the first column of dummy cell array 222(2) are adjacent to a second side of the memory cell array 210 and have first ends coupled to second ends of the $N^{th}$ column of memory cells 2122 of the neighbor sub-memory cell array 212.

In other words, the $N^{th}$ column of memory cells 2122 correspond to the $N^{th}$ column of dummy cells 2222 of the dummy cell array 222(1) of the sub-memory cell array 212, and the first column of memory cells 2122 correspond to the first column of dummy cells 2222 of the dummy cell array 222(2) of the sub-memory cell array 212. That is, the address of the $N^{th}$ column of memory cells 2122 of the sub-memory cell array 212 is the relative address of the $N^{th}$ column of dummy cells 2222 of the dummy cell array 222(1), and the address of the first column of memory cells 2122 of the sub-memory cell array 212 is the relative address of the first column of dummy cells 2222 of the dummy cell array 222(2).

The address decoding unit 230 includes a column decoder 232 and a row decoder 234, both of which select the bit line 250 and the word line 260 according to a column address and a row address of an address signal S1. The synchronous programming circuit 240 may be selectively disposed inside or outside the address decoding unit 230. The sense amplifier unit 270 includes many sense amplifiers 272, each sense amplifiers 272 coupled to the bit line 250 through the column decoder 232.

The synchronous programming circuit 240 is controlled by a program enable signal S2. When the program enable signal S2 has the enable level and the address signal S1 is the relative address of the $N^{th}$ column of dummy cells 2222 of the dummy cell array 222(1), the synchronous programming circuit 240 controls the second ends of the $N^{th}$ column of dummy cells 2222 of the dummy cell array 222(1) and the second ends of the $N^{th}$ column of memory cells 2122 of the sub-memory cell array 212 to be synchronously programmed. Wherein, the synchronous programming circuit 240 electrically connects bit lines 250 respectively corresponding to the $N^{th}$ column of dummy cells 2222 of the dummy cell array 222(1) and the $N^{th}$ column of memory cells 2122 of the sub-memory cell array 212. Alternatively, the synchronous programming circuit 240 provides the same bias to bit lines 250 respectively corresponding to the $N^{th}$ column of dummy cells 2222 of the dummy cell array 222(1) and the $N^{th}$ column of memory cells 2122 of the sub-memory cell array 212 with the same voltage.

Similarly, when the program enable signal S2 has the enable level and the address signal S1 is the relative address of the first column of dummy cells 2222 of the dummy cell array 222(2), the synchronous programming circuit 240 controls the first ends of the first column of dummy cells 2222 of the dummy cell array 222(2) and the first ends of the first column of memory cells 2122 of the sub-memory cell array 212 to be synchronously programmed.

In addition, the synchronous programming circuit 240 may also be controlled by a pre-program enable signal S3. When the pre-program enable signal S3 has the enable level and the address signal S1 is the relative address of the $N^{th}$ column of dummy cells 2222 of the dummy cell array 222(1), the synchronous programming circuit 240 controls the second ends of the $N^{th}$ column of dummy cells 2222 of the dummy cell array 222(1) and the second ends of the $N^{th}$ column of memory cells 2122 of the sub-memory cell array 212 to be synchronously programmed.

Similarly, when the pre-program enable signal S3 has the enable level and the address signal S1 is the relative address of the first column of dummy cells 2222 of the dummy cell array 222(2), the synchronous programming circuit 240 controls the first ends of the first column of dummy cells 2222 of the dummy cell array 222(2) and the first ends of the first column of memory cells 2122 of the sub-memory cell array 212 to be synchronously programmed.

Figure 5:
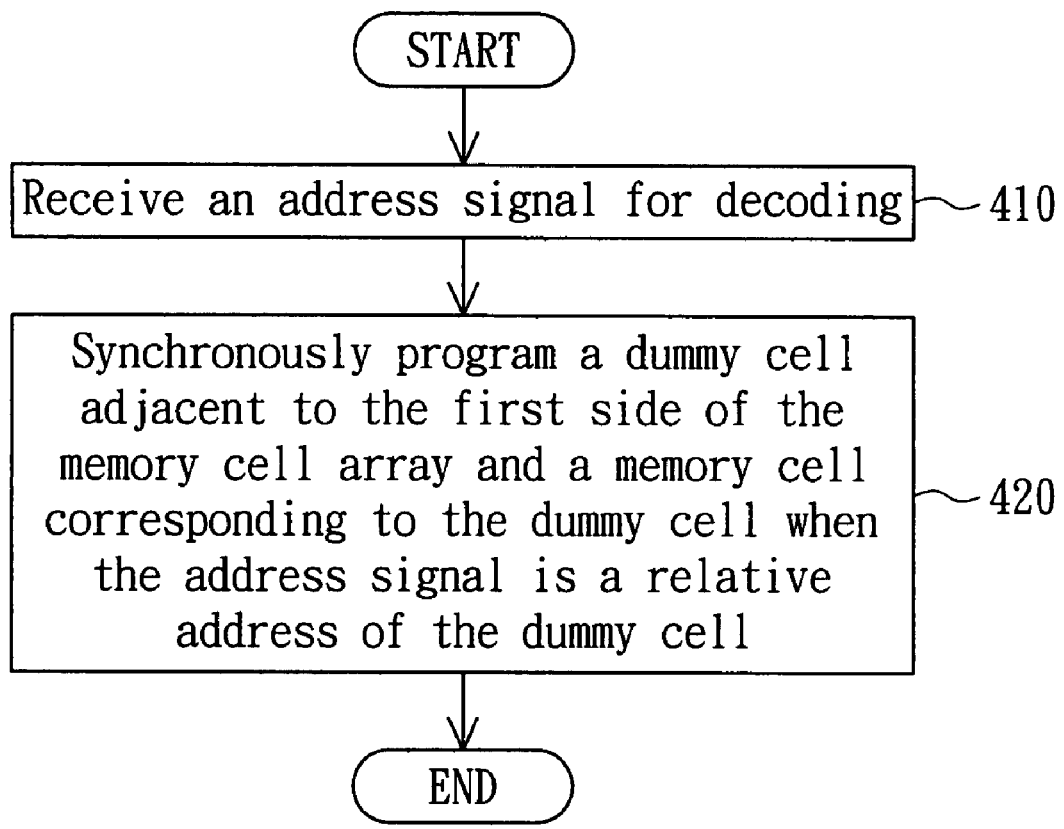
FIG. 5 is a schematic illustration showing an operating method of the non-volatile memory according to the preferred embodiment of the invention.

FIG. 5 is a schematic illustration showing an operating method of the non-volatile memory according to the preferred embodiment of the invention. Referring to FIG. 4, the operating method of the non-volatile memory 20 includes the following steps. First, as shown in step 410, the address decoding unit 230 receives the address signal S1 for decoding. Next, as shown in step 420, when the address signal S1 is the relative address of the dummy cell 2222 adjacent to the first side of the memory cell array 210, the dummy cell 2222 adjacent to the first side of the memory cell array 210 and the memory cell 2122 corresponding to the dummy cell 2222 adjacent to the first side of the memory cell array 210 are synchronously programmed.

For example, when the address signal S1 is the relative address of the $N^{th}$ column of dummy cells 2222 of the dummy cell array 222(1), the synchronous programming circuit 240 controls the second ends of the $N^{th}$ column of dummy cells 2222 of the dummy cell array 222(1) and the second ends of the N$^{th}$ column of memory cells 2122 of the sub-memory cell array 212 to be synchronously programmed. Alternatively, when the address signal S1 is the relative address of the first column of dummy cells 2222 of the dummy cell array 222(2), the synchronous programming circuit 240 controls the first ends of the first column of dummy cells 2222 of the dummy cell array 222(2) and the first ends of the first column of memory cells 2122 of the sub-memory cell array 212 to be synchronously programmed.

Figure 6:
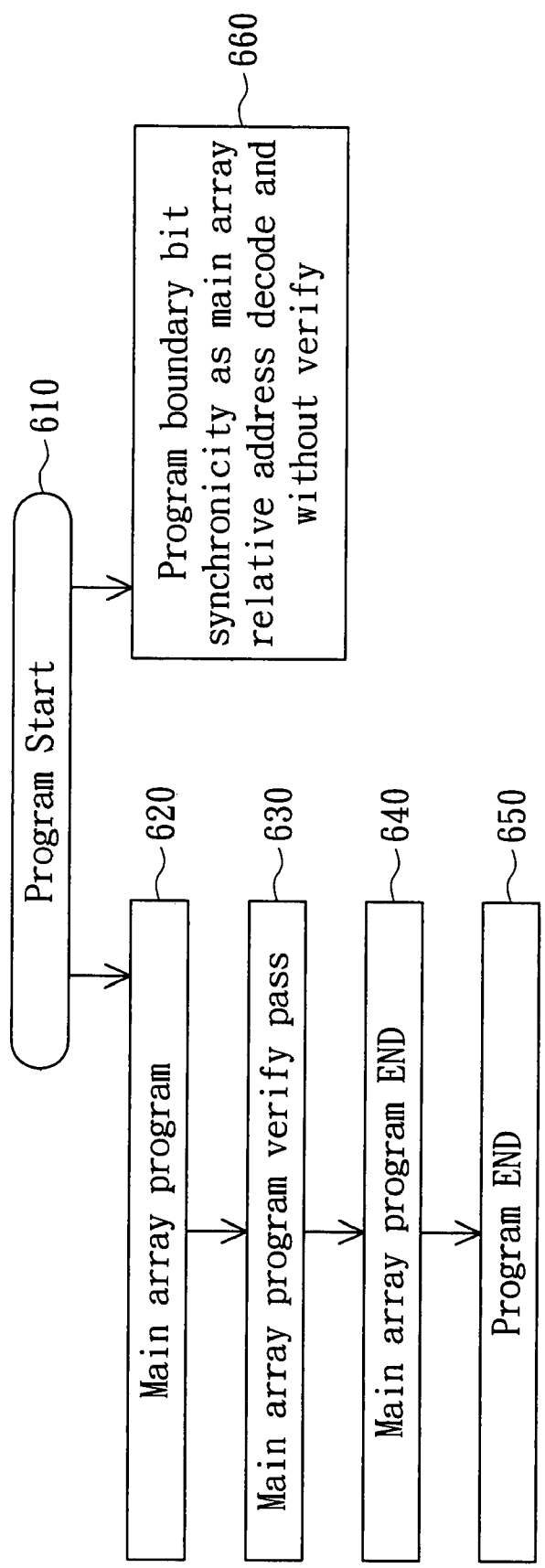
FIG. 6 is a schematic illustration showing a program method of the non-volatile memory according to the preferred embodiment of the invention.

FIG. 6 is a schematic illustration showing a program method of the non-volatile memory according to the preferred embodiment of the invention. Referring to FIG. 6, the program method of the non-volatile memory includes the following steps. First, as shown in step 610, the program sequence starts to be operated. Next, as shown in step 620, the main array is programmed. Wherein, the main array is such as the memory cell array 210. Then, as shown in step 630, main array passes program verification. Next, as shown in step 640, the main array program sequence is ended. Then, as shown in step 650, the program sequence is ended. Wherein, when a relative address of the main array is decoded, the boundary bit is synchronicity programmed without verifying. The boundary bit is such as one end of the dummy cell 2222 adjacent to the memory cell 2122.

In the non-volatile memory and the operating method thereof according to the invention, the dummy cells adjacent to the memory cell array are synchronously programmed. Consequently, it is possible to prevent the over erase phenomenon from happening so that the correct read result may be obtained. Furthermore, because the dummy cells and the memory cell array are synchronously programmed, the programming time of the non-volatile memory is shortened and the testing cost of the non-volatile memory can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A non-volatile memory, comprising:
 a memory cell array, which comprises a first memory cell;
 a first dummy cell array comprising a first dummy cell, which is adjacent to a first side of the memory cell array and corresponds to the first memory cell;
 an address decoding unit for receiving an address signal for decoding; and
 a synchronous programming circuit for controlling the first dummy cell and the first memory cell to be synchronously programmed when the address signal is a relative address of the first dummy cell;
 wherein the synchronous programming circuit is further controlled by a pre-program enable signal, and controls the first dummy cell and the first memory cell to be synchronously programmed when the pre-program enable signal has an enable level and the address signal is equal to the relative address of the first dummy cell.

2. The non-volatile memory according to claim 1, wherein when the address signal is the relative address of the first dummy cell, the synchronous programming circuit electrically connects bit lines respectively corresponding to the first dummy cell and the first memory cell to control the first dummy cell and the first memory cell to be synchronously programmed.

3. The non-volatile memory according to claim 1, wherein when the address signal is the relative address of the first dummy cell, the synchronous programming circuit provides the same bias to bit lines respectively corresponding to the first dummy cell and the first memory cell to control the first dummy cell and the first memory cell to be synchronously programmed.

4. The non-volatile memory according to claim 1, wherein the synchronous programming circuit is disposed in the address decoding unit.

5. The non-volatile memory according to claim 1, wherein one end of the first dummy cell is coupled to the first side of the memory cell array, and the synchronous programming circuit controls the one end of the first dummy cell and the first memory cell to be synchronously programmed.

6. The non-volatile memory according to claim 1, wherein the memory cell array comprises a second memory cell, the non-volatile memory further comprises a second dummy cell array, the second dummy cell array comprises a second dummy cell, which is adjacent to a second side of the memory cell array and corresponds to the second memory cell, and the synchronous programming circuit controls the second dummy cell and the second memory cell to be synchronously programmed when the address signal is equal to the relative address of the second dummy cell.

7. The non-volatile memory according to claim 1, wherein the non-volatile memory is a non-volatile flash memory.

8. An operating method of a non-volatile memory, the non-volatile memory comprising a memory cell array and a first dummy cell array, the memory cell array comprising a first memory cell, the first dummy cell array comprising a first dummy cell, which is adjacent to a first side of the memory cell array and corresponds to the first memory cell, the operating method comprising the steps of:
 (a) receiving an address signal for decoding; and
 (b) synchronously programming the first dummy cell and the first memory cell when the address signal is a relative address of the first dummy cell;
 wherein the non-volatile memory controls the first dummy cell and the first memory cell to be synchronously programmed through a synchronous programming circuit;
 wherein the synchronous programming circuit is further controlled by a pre-program enable signal, and controls the first dummy cell and the first memory cell to be synchronously programmed when the pre-program enable signal has an enable level and the address signal is the relative address of the first dummy cell.

9. The method according to claim 8, wherein the step (b) is for electrically connecting bit lines respectively corresponding to the first dummy cell and the first memory cell and thus synchronously programming the first dummy cell and the first memory cell.

10. The method according to claim 8, wherein the step (b) is for providing the same bias to bit lines respectively corresponding to the first dummy cell and the first memory cell and thus for synchronously programming the first dummy cell and the first memory cell.

11. The method according to claim 8, wherein the synchronous programming circuit is disposed in an address decoding unit.

12. The method according to claim 8, wherein one end of the first dummy cell is coupled to the first side of the memory cell array, and the synchronous programming circuit controls the one end of the first dummy cell and the first memory cell to be synchronously programmed.

13. The method according to claim 8, wherein the memory cell array further comprises a second memory cell, the non-volatile memory further comprises a second dummy cell array, the second dummy cell array comprises a second dummy cell, which is adjacent to a second side of the memory cell array and corresponds to the second memory cell, and the synchronous programming circuit controls the second dummy cell and the second memory cell to be synchronously programmed when the address signal is the relative address of the second dummy cell.

14. The method according to claim 8, wherein the non-volatile memory is a non-volatile flash memory.

* * * * *